United States Patent
Zuo et al.

(10) Patent No.: US 9,203,373 B2
(45) Date of Patent: Dec. 1, 2015

(54) DIPLEXER DESIGN USING THROUGH GLASS VIA TECHNOLOGY

(71) Applicant: QUALCOMM Incorporated, San Diego, CA (US)

(72) Inventors: Chengjie Zuo, Santee, CA (US); Jonghae Kim, San Diego, CA (US); Mario Francisco Velez, San Diego, CA (US); Je-Hsiung Lan, San Diego, CA (US); Daeik D. Kim, San Diego, CA (US); Changhan Yun, San Diego, CA (US); David F. Berdy, West Lafayette, IN (US); Robert P. Mikulka, Oceanside, CA (US); Matthew M. Nowak, San Diego, CA (US); Xiangdong Zhang, Westford, MA (US); Puay H. See, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 155 days.

(21) Appl. No.: 13/798,733

(22) Filed: Mar. 13, 2013

(65) Prior Publication Data

US 2014/0197902 A1 Jul. 17, 2014

Related U.S. Application Data

(60) Provisional application No. 61/751,539, filed on Jan. 11, 2013.

(51) Int. Cl.
*H03H 7/46* (2006.01)
*H03H 3/00* (2006.01)
(Continued)

(52) U.S. Cl.
CPC ............. *H03H 7/461* (2013.01); *H01L 23/64* (2013.01); *H03H 3/00* (2013.01); *H03H 7/463* (2013.01);
(Continued)

(58) Field of Classification Search
CPC ............ H03J 7/461; H03J 7/463; H03J 3/00; H05K 1/165; H01L 23/64
USPC .......................................... 333/126–129, 132
See application file for complete search history.

(56) References Cited

U.S. PATENT DOCUMENTS 2,757,320 A 7/1956 Schuh, Jr.
3,656,162 A 4/1972 Thomas
(Continued)

FOREIGN PATENT DOCUMENTS

DE 102006058068 A1 6/2008
EP 1411553 A1 4/2004
(Continued)

OTHER PUBLICATIONS

Buisman K., et al., "A Monolithic Low-Distortion Low-Loss Silicon-on-Glass Varactor-Tuned Filter With Optimized Biasing", IEEE Microwave and Wireless Components Letters, IEEE Service Center, NewYork, NY, US, vol. 17, No. 1, Jan. 1, 2007, pp. 58-60, XP011154487, ISSN: 1531-1309, DOI: 10.1109/LMWC.2006.887262 ch. III, 1st paragraph.
(Continued)

*Primary Examiner* — Robert Pascal
*Assistant Examiner* — Kimberly Glenn
(74) *Attorney, Agent, or Firm* — Xiaotun Qiu

(57) ABSTRACT

A diplexer includes a substrate having a set of through substrate vias. The diplexer also includes a first set of traces on a first surface of the substrate. The first traces are coupled to the through substrate vias. The diplexer further includes a second set of traces on a second surface of the substrate that is opposite the first surface. The second traces are coupled to opposite ends of the set of through substrate vias. The through substrate vias and the traces also operate as a 3D inductor. The diplexer also includes a capacitor supported by the substrate.

20 Claims, 14 Drawing Sheets

(51) Int. Cl.
| | |
|---|---|
| *H05K 1/16* | (2006.01) |
| *H01L 23/64* | (2006.01) |
| *H03H 1/00* | (2006.01) |
| *H01L 23/15* | (2006.01) |
| *H01L 23/498* | (2006.01) |
| *H03H 7/01* | (2006.01) |
| *H01F 17/00* | (2006.01) |
| *H01L 23/48* | (2006.01) |
| *H01L 23/522* | (2006.01) |
| *H05K 1/02* | (2006.01) |
| *H05K 1/03* | (2006.01) |
| *H01L 23/66* | (2006.01) |

(52) U.S. Cl.
CPC .......... *H05K 1/165* (2013.01); *H01F 2017/004* (2013.01); *H01F 2017/0026* (2013.01); *H01L 23/15* (2013.01); *H01L 23/481* (2013.01); *H01L 23/49827* (2013.01); *H01L 23/5223* (2013.01); *H01L 23/5227* (2013.01); *H01L 23/66* (2013.01); *H01L 2924/0002* (2013.01); *H03H 7/1758* (2013.01); *H03H 7/1766* (2013.01); *H03H 7/1791* (2013.01); *H03H 2001/0021* (2013.01); *H05K 1/0233* (2013.01); *H05K 1/0306* (2013.01); *H05K 2201/09627* (2013.01); *H05K 2201/09672* (2013.01); *H05K 2201/10015* (2013.01); *H05K 2201/10098* (2013.01); *Y10T 29/49128* (2015.01)

(56) References Cited

U.S. PATENT DOCUMENTS

| | | | |
|---|---|---|---|
| 5,548,255 | A | 8/1996 | Spielman |
| 5,696,471 | A | 12/1997 | Fujiwara |
| 5,793,265 | A * | 8/1998 | Spielman ............ 333/132 |
| 5,815,052 | A | 9/1998 | Nakajima et al. |
| 5,886,597 | A | 3/1999 | Riad |
| 6,180,976 | B1 * | 1/2001 | Roy ................ 257/306 |
| 6,366,564 | B1 | 4/2002 | Hiraka et al. |
| 6,597,258 | B2 | 7/2003 | Rosenbaum |
| 6,597,315 | B2 | 7/2003 | Yokoshima et al. |
| 7,498,918 | B2 | 3/2009 | Hsu et al. |
| 7,564,319 | B2 | 7/2009 | Ding et al. |
| 7,586,755 | B2 | 9/2009 | Satoh et al. |
| 7,678,695 | B2 | 3/2010 | Taniguchi et al. |
| 7,821,359 | B2 | 10/2010 | Hart |
| 7,924,116 | B2 | 4/2011 | Ono et al. |
| 8,069,560 | B2 | 12/2011 | Mori et al. |
| 8,324,984 | B2 | 12/2012 | Gavin et al. |
| 8,339,233 | B2 | 12/2012 | Tsai et al. |
| 8,362,591 | B2 | 1/2013 | Yen et al. |
| 8,736,399 | B2 | 5/2014 | Solski et al. |
| 8,803,615 | B2 | 8/2014 | Cabanillas et al. |
| 2001/0044292 | A1 | 11/2001 | Jeon et al. |
| 2004/0124961 | A1 | 7/2004 | Aoyagi |
| 2008/0166980 | A1 | 7/2008 | Fukamachi et al. |
| 2009/0219908 | A1 * | 9/2009 | Rofougaran ............ 370/343 |
| 2009/0225525 | A1 | 9/2009 | Mano et al. |
| 2010/0289126 | A1 | 11/2010 | Pagaila et al. |
| 2011/0095395 | A1 | 4/2011 | Ellul et al. |
| 2011/0110385 | A1 | 5/2011 | Gorostegui et al. |
| 2011/0248405 | A1 | 10/2011 | Li et al. |
| 2011/0291786 | A1 | 12/2011 | Li et al. |
| 2012/0075216 | A1 | 3/2012 | Black et al. |
| 2012/0080771 | A1 | 4/2012 | Yang et al. |
| 2012/0302188 | A1 | 11/2012 | Sahota et al. |
| 2013/0011995 | A1 | 1/2013 | Watanabe |
| 2013/0207745 | A1 * | 8/2013 | Yun et al. ............ 333/185 |
| 2013/0223412 | A1 | 8/2013 | Sambhwani |
| 2014/0197902 | A1 | 7/2014 | Zuo et al. |
| 2014/0268616 | A1 | 9/2014 | Lan et al. |
| 2014/0327496 | A1 | 11/2014 | Zuo et al. |
| 2014/0354372 | A1 | 12/2014 | Zuo et al. |

FOREIGN PATENT DOCUMENTS

| | | |
|---|---|---|
| JP | S5291446 U | 7/1977 |
| JP | H0945866 A | 2/1997 |
| JP | 2002008942 A | 1/2002 |
| JP | 2003100553 A | 4/2003 |
| WO | 9923702 A1 | 5/1999 |
| WO | 2007061308 A1 | 5/2007 |
| WO | 2008069783 A1 | 6/2008 |
| WO | 2009118694 A1 | 10/2009 |
| WO | 2010107430 A1 | 9/2010 |
| WO | 2012144482 A1 | 10/2012 |

OTHER PUBLICATIONS

International Search Report and Written Opinion—PCT/2014/011223—ISA/EPO—Jul. 4, 2014.

Methot F., "Constant Impedance Bandpass and Diplexer Filters", RF Design, Primedia Business Magazines & Media, vol. 9, No. 11, Nov. 1986, XP001086415, abstract; figure 8(a).

Saitou, K., et al "Tunable duplexer having multiayer structure using LTCC" Microwave Symposium Digest, 2003 IEEE MIT-S International, Philadephia, PA Jun. 8-13, 2003 vol. 3 pp. 1763-1766.

Sakhnenko S., et al., "Ultra-low-profile small-size LTCC front-end module (FEM) for WLAN applications based on a novel diplexer design approach", Microwave Symposium Digest, 2009, MTT '09, IEEE MTT-S International, IEEE, Piscataway, NJ, USA, Jun. 7, 2009, pp. 609-612, XP031490592, ISBN: 978-1-4244-2803-8 the whole document.

Vitale W.A., et al., "High-Q 3D embedded inductors using TSV for RF MEMS tunable bandpass filters (4.65 6.8 GhZ)", IEEE European Microwave Integrated Circuits Conference, Oct. 29, 2012, pp. 822-825, XP032345713, section I, II; figures 1,6.

Buisman, et al., ""Distortion-Free" Varactor Diode Topologies for RF Adapativity," 2005 IEEE MTT-S International Microwave Symposium Digest, 2005, pp. 157-160.

Co-pending U.S. Appl. No. 14/019,821, filed Sep. 6, 2013.

Shariff D., et al., "Integration of fine-pitched Through-Silicon Vias and Integrated Passive Devices", IEEE Electronic Components and Technology Conference 2011, XP031996634, pp. 844-848.

Kim T.W., et al., "A Compact Sized LTCC Diplexer With High-band Selectivity and High Isolation for GSM and CDMA Multi-band Applications", Microwave Conference, 2009. APMC 2009. ASIA Pacific, IEEE, Piscataway, NJ, USA, Dec. 7, 2009, pp. 2080-2083, XP031614071, ISBN:978-1-4244-2801-4.

Liu. K. et al., "Investigation of Integrated Passive Device With Through-silicon Via", Electronic Components and Technology Conference (ECTC), 2012 IEEE 62nd, IEEE, May 29, 2012, pp. 1833-1839, XP032210840, DOI: 10.1109/ECTC.2012.6249087, ISBN: 978-1-4673-1966-9.

Sridharan V., et al., "Design and fabrication of bandpass filters in glass interposer with through-package-vias (TPV)", Electronic Components and Technology Conference(ECTC), 2010 Proceedings 60th, IEEE, Piscataway, NJ, USA, Jun. 1, 2010, pp. 530-535, XP031694140.

Sun L., et al., "System Integration Using Silicon-based Integrated Passive Device Technology", Radio-Frequency Integration Technology (RFIT), 2012 IEEE International Symposium on, IEEE, Nov. 21, 2012, pp. 98-100, XP032298422, DOI: 10.1109/RFIT.2012.6401626, ISBN: 978-1-4673-2303-1.

* cited by examiner

DIPLEXER DESIGN USING THROUGH GLASS VIA TECHNOLOGY

CROSS-REFERENCE TO RELATED APPLICATIONS

This application claims the benefit under 35 U.S.C. §119 (e) to U.S. Provisional Patent Application No. 61/751,539 entitled "DIPLEXER DESIGN USING THROUGH GLASS VIA TECHNOLOGY" filed on Jan. 11, 2013, the disclosure of which is expressly incorporated by reference herein in its entirety.

TECHNICAL FIELD

The present disclosure generally relates to integrated circuits (ICs). More specifically, the present disclosure relates to diplexer designs using through glass via or through substrate via technology.

BACKGROUND

For wireless communication, a diplexer can help process signals carried in a carrier aggregation system. In carrier aggregation systems, signals are communicated with both high band and low hand frequencies. In a chipset, the diplexer is usually inserted between an antenna and a tuner (or an RF switch) to ensure high performance. Usually, a diplexer design includes inductors and capacitors. Diplexers can attain high performance by using inductors and capacitors that have a high quality factor (or Q). High performance diplexers can also be attained by reducing the electromagnetic coupling between components, which may be achieved through an arrangement of the geometry and direction of the components. Diplexer performance may be quantified, by measuring the insertion loss and rejection (e.g., quantities expressed in decibels (dB)) at certain frequencies.

The diplexer fabrication process may be compatible with standard semiconductor processes, such as processes for fabricating voltage-controlled capacitors (varactors), switched-array capacitors, or other like capacitors. It may be beneficial to fabricate the components of the diplexer design on a single substrate. Fabrication on a single substrate may also enable tunable diplexers that are tuned through a variety of different parameters.

Fabricating high performance diplexers in an efficient and cost-effective manner is problematic. Increasing the Q of the inductors and the capacitors in the diplexer is also an issue. Reducing the electromagnetic coupling between the various components in the diplexer, while decreasing the size of the diplexer and making the most economical use of resources, would be beneficial.

SUMMARY

In one aspect of the disclosure, a diplexer includes a substrate having a set of through substrate vias. The diplexer also includes a first set of traces on a first surface of the substrate. The first traces are coupled to the through substrate vias. The diplexer further includes a second set of traces on a second surface of the substrate that is opposite the first surface. The second traces are coupled to opposite ends of the through substrate vias. The through substrate vias and the traces operate as a 3D inductor. The diplexer also includes a capacitor supported by the substrate.

Another aspect of the disclosure is directed to a diplexer that includes a first port, a second port and a third port. The diplexer also includes a low pass filter between two of the first port, the second port and the third port. The diplexer further includes a second pass filter between two other of the first port, the second port and the third port. The second pass filter is a band pass filter or a high pass filter.

In another aspect of the disclosure, a method of fabricating a diplexer is described. The method includes forming a set of through substrate vias in a substrate. A first set of traces is deposited on a first surface of the substrate. A second set of traces is deposited on a second surface of the substrate. The first traces are coupled to first sides of the through substrate vias. The second traces are coupled to second sides of the set of through substrate vias to form a serpentine 3D inductor. A capacitor is formed on the substrate.

Another aspect of the disclosure is directed to a diplexer including a substrate having a set of through substrate vias. The diplexer also includes a first set of traces on a first surface of the substrate. The diplexer further includes a first means for coupling the through substrate vias on the first surface of the substrate. The diplexer further includes a second means for coupling opposite ends of the through substrate vias on a second surface of the substrate opposite the first surface. The first traces and the first means for coupling and the second means for coupling also operate as a 3D inductor. The diplexer also includes means for storing charge supported by the substrate.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Figure 1:
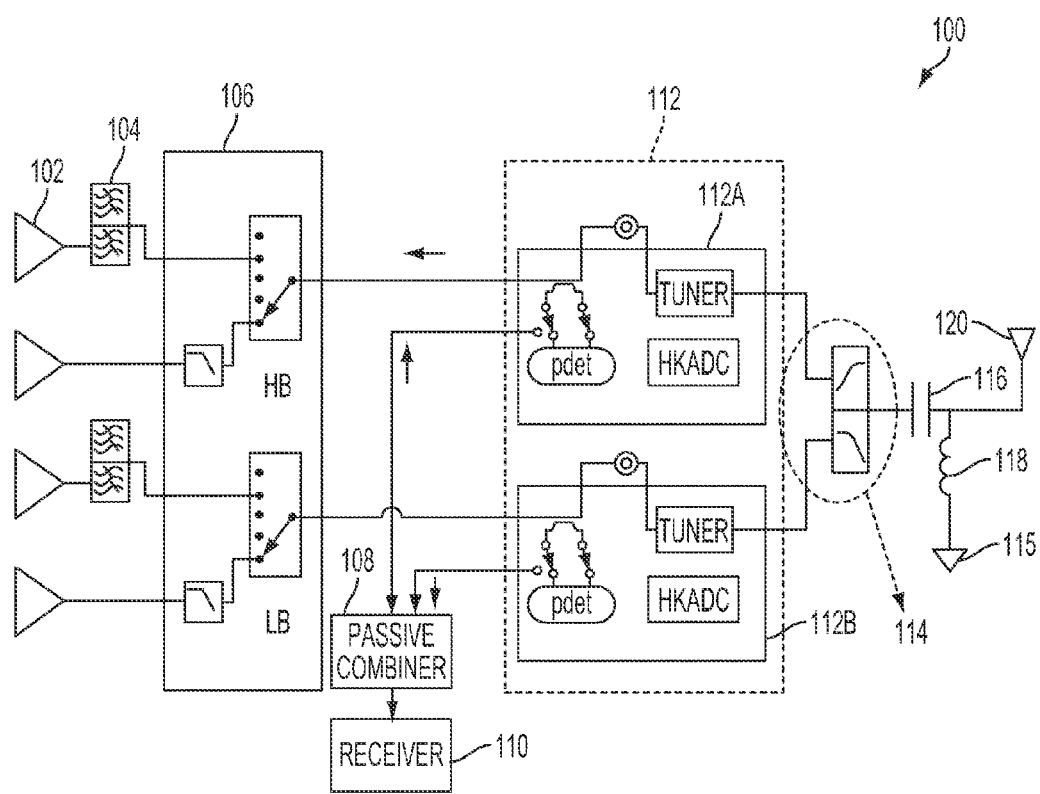
FIG. 1 is a schematic diagram of a chipset employing a diplexer according to an aspect of the present disclosure.

FIG. 1 is a schematic diagram of a chipset 100 employing a diplexer 114 according to an aspect of the present disclosure. The chipset 100 includes a power amplifier 102, a duplexer/filter 104, a radio frequency (RE) switch module 106, a passive combiner 108, a receiver 110, a tuner circuitry 112 (e.g., a first tuner circuitry 112A and a second tuner circuitry 112B), a diplexer 114, a capacitor 116, an inductor 118, a ground terminal 115 and an antenna 120. The power amplifier 102 amplifies signal(s) to a certain power level for transmission. The duplexer/filter 104 filters the input/output signals according to a variety of different parameters, including frequency, insertion loss, rejection or other like parameters. The RF switch module 106 may select certain portions of the input signals to pass on to the rest of the chipset 100. The passive combiner 108 combines the detected power from the first tuner circuitry 112A and the second tuner circuitry 112B. The receiver 110 processes the information from the passive combiner 108 and uses this information to further operate the chipset 100. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 120.

As shown in FIG. 1, the diplexer 114 is between the tuner component of the tuner circuitry 112 and the capacitor 116, the inductor 118 and the antenna 120. The diplexer 114 may be placed between the antenna 120 and the tuner circuitry 112 to provide high system performance for the chipset 100. The diplexer 114 also performs frequency domain multiplexing on both high band frequencies and low band frequencies. After the diplexer 114 performs its frequency multiplexing functions on the input signals, the output of the diplexer 114 is fed to an optional LC (inductor/capacitor) network including the capacitor 116 and the inductor 118. The LC network may provide extra impedance matching components for the antenna 120, when desired. Then a signal with the particular frequency is transmitted or received by the antenna 120.

Figure 2A:
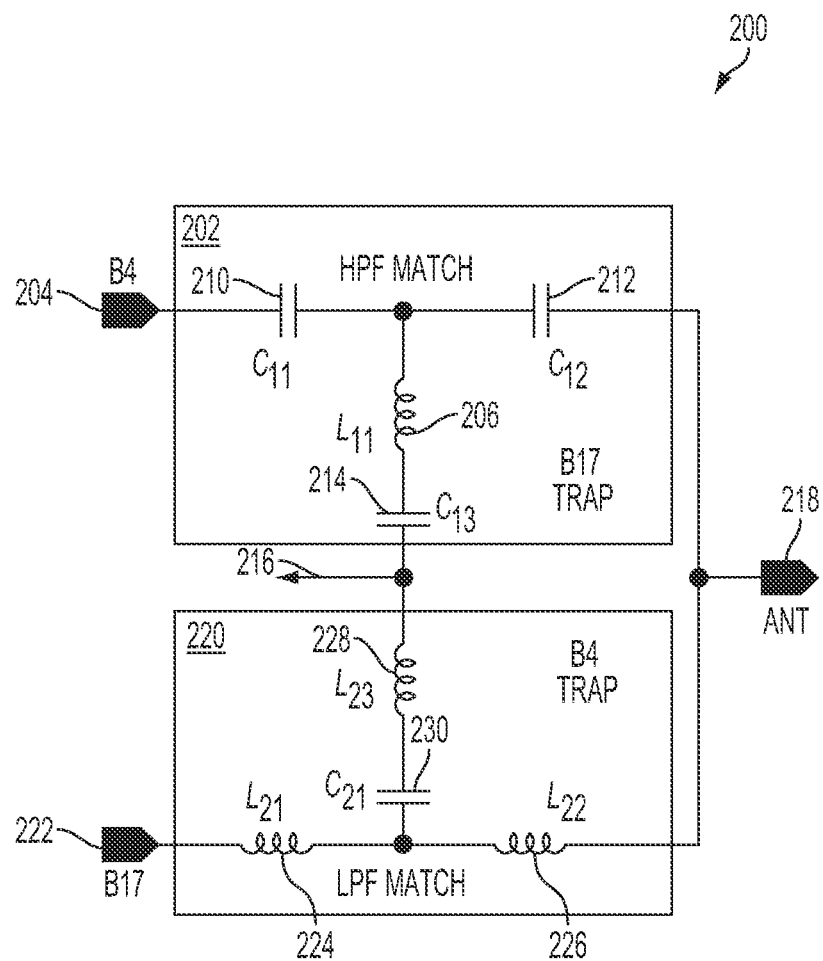
FIG. 2A is a schematic diagram of a diplexer design according to an aspect of the present disclosure.

FIG. 2A is a schematic diagram of a diplexer design 200 according to an aspect of the present disclosure. The diplexer design 200 includes a first input port 204, a second input port 222, a high pass filter match block 202, a low pass filter match block 220, a ground terminal 216, and an antenna port 218. The high pass filter match block 202 includes a first capacitor 210 ($C_{11}$), a second capacitor 212 ($C_{12}$), a first inductor 206 ($L_{11}$), and a third capacitor 214 ($C_{13}$). The low pass filter match block 220 includes a second inductor 224 ($L_{21}$), a fourth capacitor 230 ($C_{21}$), a third inductor 226 ($L_{22}$), and a fourth inductor 228 ($L_{23}$). In this configuration, a topology of the diplexer design 200 uses the high pass filter match block 202 to trap frequencies from the second input port 222, and uses the low pass filter match block 220 to trap frequencies from the first input port 204. In one implementation, the high pass filter match block 202 may operate as a low pass filter or a band pass filter. In another implementation, the low pass filter match block 220 may operate as a high pass filter or a hand pass filter. In a further implementation, the high pass filter match block 202 and the low pass filter match block 220 are different types of filters. The high pass fitter match block 202 and the low pass filter match block 220 may also be the same type of filter.

Figure 2B:
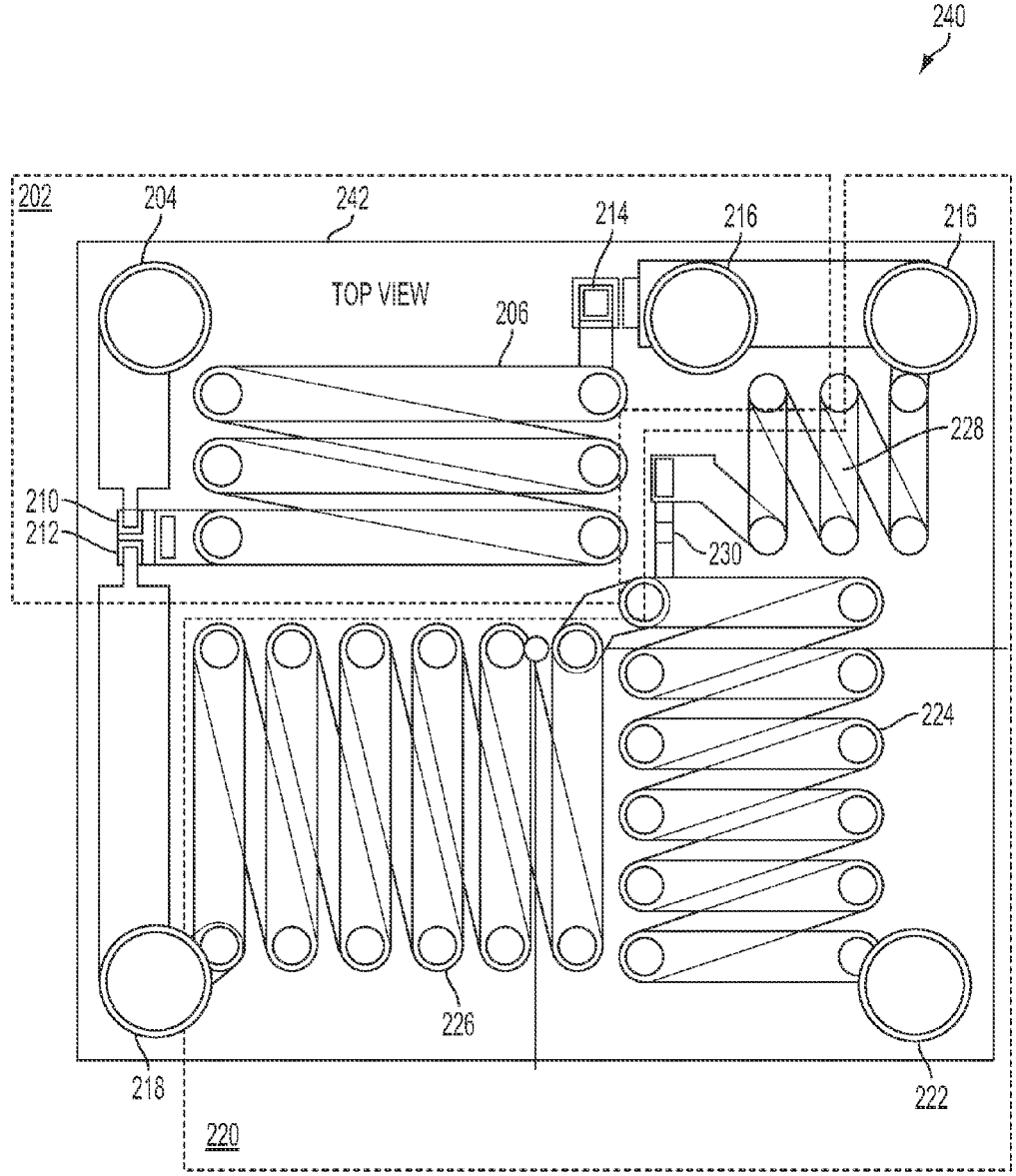
FIG. 2B is a top view of a layout of a diplexer design according to an aspect of the present disclosure.

FIG. 2B is a top view of a layout of a diplexer design 240 according to an aspect of the present disclosure. The layout of the diplexer design 240 corresponds to the schematic diagram of the diplexer design 200 from FIG. 2A. Also, the components are implemented within (or on) semiconductor substrate 242. As described herein, the term "semiconductor substrate" may refer to a substrate of a diced wafer or may refer to the substrate of a wafer that is not diced. In one configuration, the semiconductor substrate is comprised of glass, air, quartz, sapphire, high-resistivity silicon, or other like semiconductor materials.

As can be seen from FIG. 2B, the first input pad 204, the second input pad 222, the ground terminal pad 216, and the antenna pad 218 may be implemented as, wafer level chip scale package (WLCSP) balls, for example. The capacitors (e.g., first capacitor 210 ($C_{11}$), the second capacitor 212 ($C_{12}$), the third capacitor 214 ($C_{13}$), and the fourth capacitor 230 ($C_{21}$)) may be implemented as a layered structure of conductive layers (e.g., a layered metal-insulator-metal structure), but are not limited to the structure shown in FIG. 2B. Furthermore, the geometry and arrangement of the various inductor and capacitor components in the diplexer design 240 reduce the electromagnetic coupling between the components.

Figure 2C:
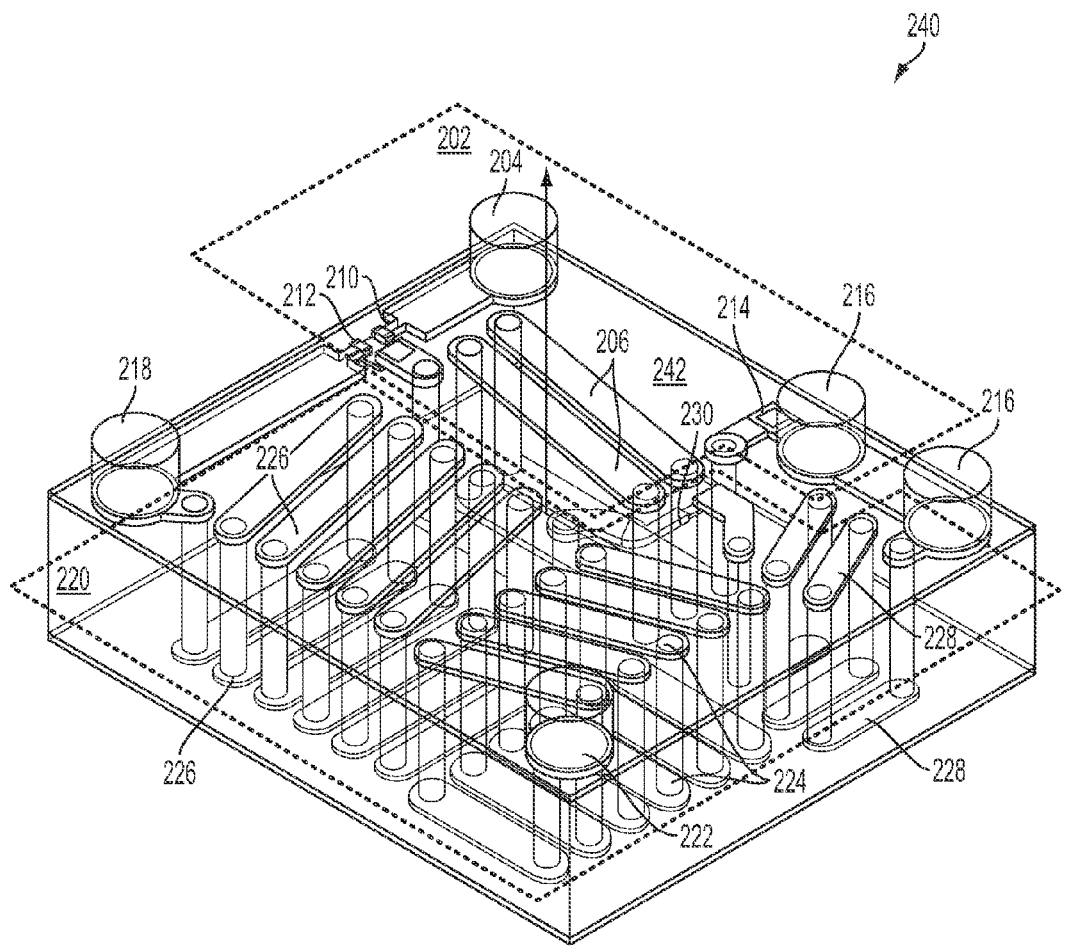
FIG. 2C is a 3D view of a layout of a diplexer design according to an aspect of the present disclosure.

In the depicted configuration, the inductors (e.g., the first inductor 206 ($L_{11}$), the second inductor 224 ($L_{21}$), the third inductor 226 ($L_{22}$), and the fourth inductor 228 ($L_{23}$)) are implemented as a series of traces and through substrate vias that are further illustrated in the 3D view of FIG. 2C. A more detailed explanation of the inductors will be provided below with respect to FIG. 2C. Again, the structures of the inductors (e.g., the first inductor 206 ($L_{11}$), the second inductor 224 ($L_{21}$), the third inductor 226 ($L_{22}$), and the fourth inductor 228 ($L_{23}$)) shown in FIG. 2B are not limited to the structures shown and can take on any structure. The layout of the diplexer design 240 is one implementation of the diplexer design 200 shown in FIG. 2A. Also, as shown in FIG. 2B, the high pass filter match block 202 and the low pass filler match block 220 are shown in the areas boxed in by the dotted-line borders.

FIG. 2C is a 3D view of a layout of a diplexer design 240 according to an aspect of the present disclosure FIG. 2C is a 3D view of the same diplexer design 240 in FIG. 2B, and therefore has the same components as shown in FIG. 2B. In FIG. 2C, the inductors (e.g., the first inductor 206 ($L_{11}$), the second inductor 224 ($L_{21}$), the third inductor 226 ($L_{22}$), and the fourth inductor 228 ($L_{23}$)) are shown as through substrate via inductors (e.g., through glass via inductors if the semiconductor substrate 242 is glass). Representatively, the inductors (e.g., the first inductor 206 ($L_{11}$), the second inductor 224 ($L_{21}$), the third inductor 226 ($L_{22}$), and the fourth inductor 228 ($L_{23}$)) are arranged from a first set of traces on a top surface of the semiconductor substrate 242, and a second set of traces on a second surface of the semiconductor substrate 242 opposite the first surface. In this configuration, the sets of traces are on opposing first and second surfaces of the semiconductor substrate 242 and coupled together by the through substrate vias in a serpentine manner. In FIG. 2C, the semiconductor substrate 242, is transparent to ease the viewing of both sets of traces and the through substrate vias of the first inductor 206 ($L_{11}$), the second inductor 224 ($L_{21}$), the third inductor 226 ($L_{22}$), and the fourth inductor 228 ($L_{23}$).

As shown in FIG. 2C, the capacitors (e.g., the first capacitor 210 ($C_{11}$), the second capacitor 212 ($C_{12}$), the third capacitor 214 ($C_{13}$), and the fourth capacitor 230 ($C_{21}$)) are deposited on the first surface of the semiconductor substrate 242. Also, the first input pad 204, the second input pad 222, the ground terminal pad 216, and the antenna pad 218 may be deposited on the first surface of the semiconductor substrate 242. The first input pad 204, the second input pad 222, the ground terminal pad 216, and the antenna pad 218 may also be accessed by a cylindrical via (or other connection) for electrically coupling to other sources of voltage/current. The high pass filter match block 202 and the low pass filter match block 220 are shown within the dotted-line borders. In one implementation, the size of the diplexer design 240 is smaller than a conventional diplexer size, for example, at least due to the use of through substrate via/through glass via inductors and metal-insulator-metal capacitors that conserve space.

Figure 3:
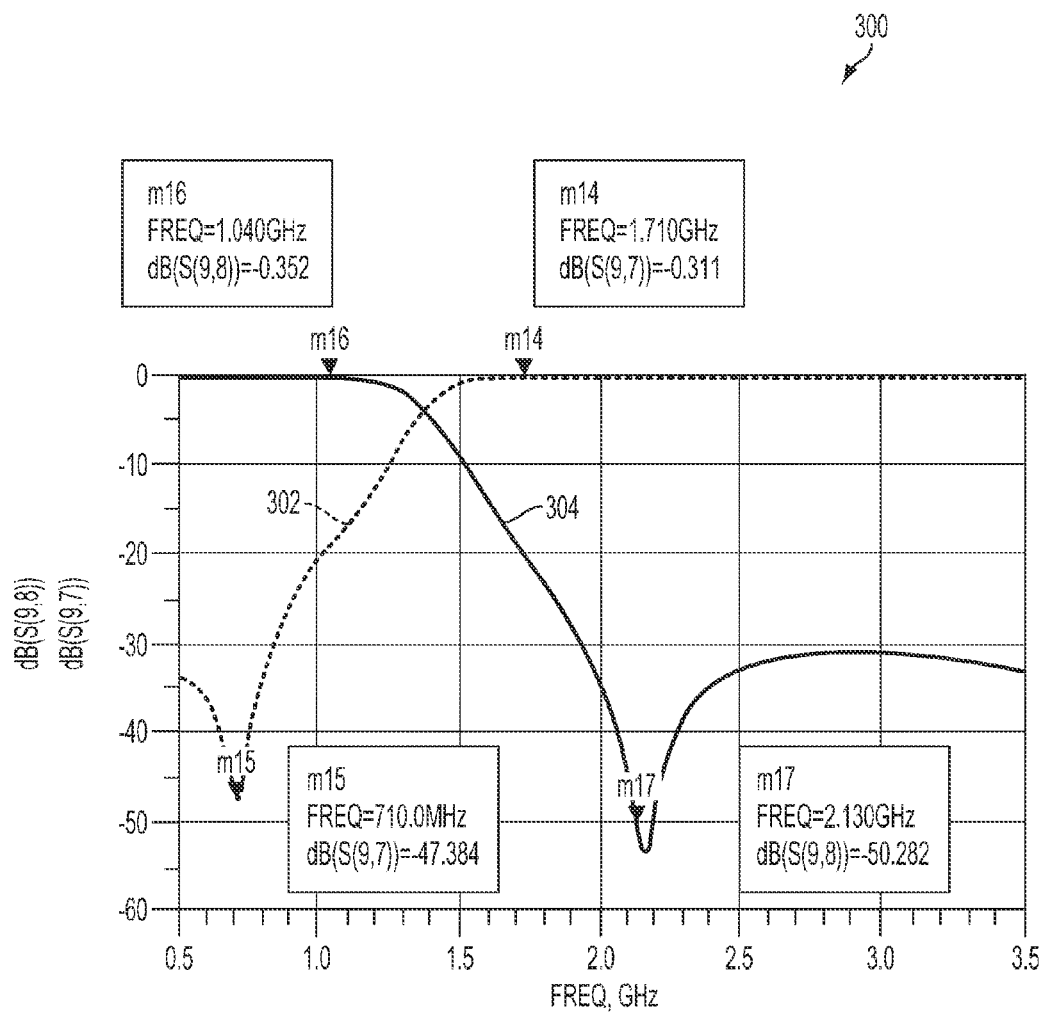
FIG. 3 is a graph illustrating performance of a diplexer design according to an aspect of the present disclosure.

FIG. 3 is a graph 300 illustrating performance of a diplexer design according to an aspect of the present disclosure. The x-axis of the graph 300 reflects the frequency in gigahertz (GHz) and the y-axis of the graph 300 reflects a decibel (dB) rating. A high pass filter curve 302 is a frequency response (transmission in dB) of a high pass filter match block (e.g., the high pass filter match block 202). A low pass filter curve 304 is a frequency response (transmission in dB) of a low pass filter match block (e.g., the low pass filter match block 220). In the diplexer configuration of FIGS. 2A-2C, an antenna pad (e.g., the antenna pad 218) is the output for both the high pass filter match block 202 and low pass filter match block 220, whereas the input pads (e.g., the first input pad 204, the second input pad 222) are separate.

Referring again to FIG. 3, as seen by point m15 on the high pass filter curve 302, at a lower frequency of 710.0 MHz, the rejection is 47 dB (e.g., the high pass filter match block rejects signals at lower frequencies). As seen by point m17 on the low pass filter curve 304, the rejection is 50 dB at 2.13 GHz. By contrast, a conventional multi-layer ceramic chip (MLCC) diplexers may be limited to less than a 40 dB rejection, especially for high frequencies above 2 GHz. For both the low pass filter and high pass filter branches, the insertion loss may be in the 0.3 dB range, which is unavailable from conventional MLCC diplexers, especially for frequencies above 2 GHz.

Therefore, a through substrate via/through glass via diplexer (e.g., the diplexer configuration of FIGS. 2A-2C) delivers improved rejection compared to the rejection available from conventional MLCC diplexers, as well as a reduced insertion loss and a smaller size. For instance, the high pass filter curve 302 shows an insertion loss of less than 0.4 dB at frequencies such as 1.7 GHz, and a rejection of 47 dB at 710 MHz. Also, the low pass filter curve 304 shows an insertion loss of less than 0.4 dB at 1.04 GHz, and a rejection of 50 dB at 2.13 GHz.

Figure 4A:
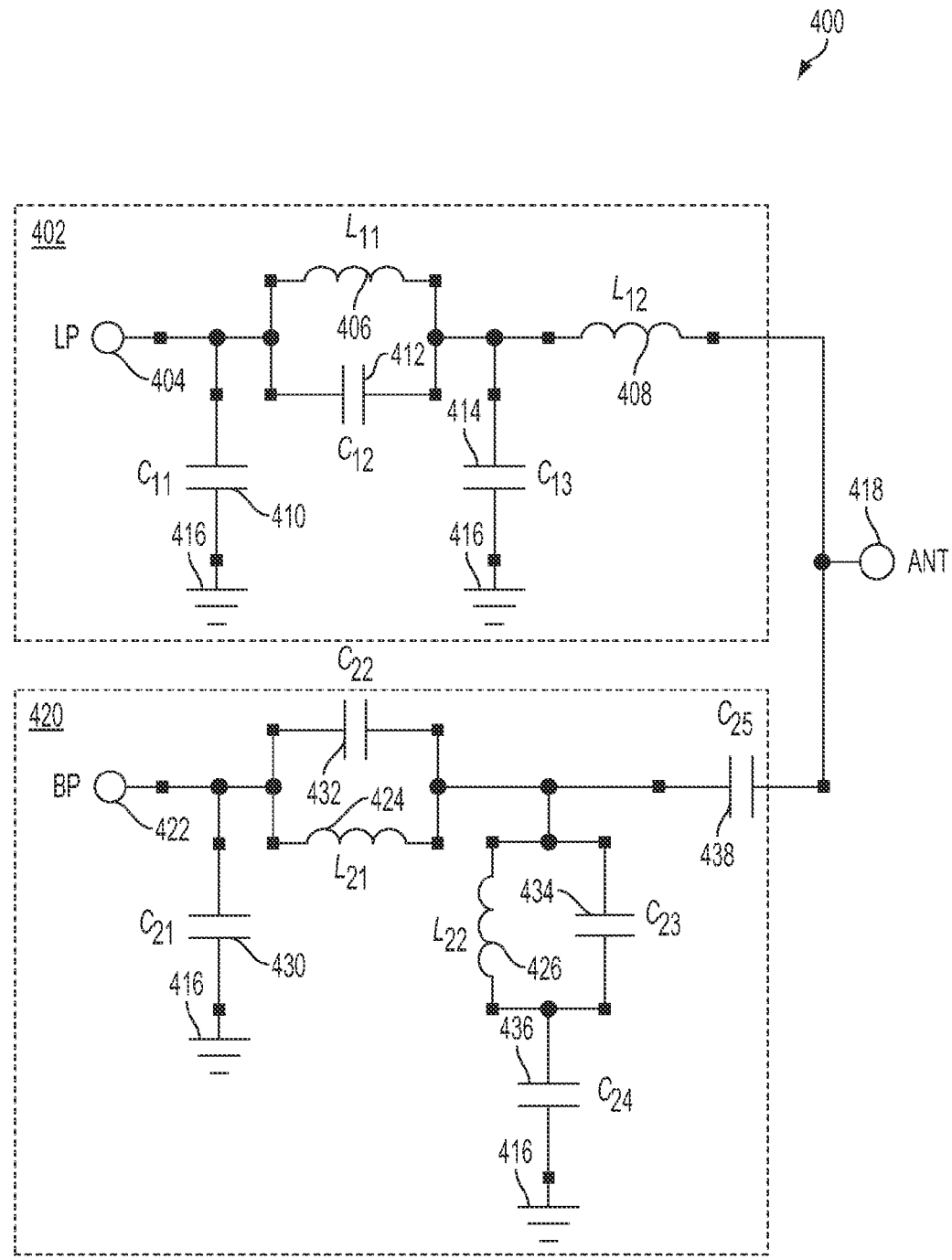
FIG. 4A is a schematic diagram of a diplexer design according to an aspect of the present disclosure.

FIG. 4A is a schematic diagram of a diplexer design 400 according to another aspect of the present disclosure. The diplexer design 400 includes a low pass filter match block 402, a band pass filter match block 420, an antenna port 418 and a ground terminal 416. The low pass filter match block 402 includes a low pass input port 404, a first inductor 406 ($L_{11}$), and a second inductor 408 ($L_{12}$). The low pass filter match block 402 also includes a first capacitor 410 ($C_{11}$), a second capacitor 412 ($C_{12}$), a third capacitor 414 ($C_{13}$), and a ground terminal 416. The band pass filter match block 420 includes a band pass input port 422, a third inductor 424 ($L_{21}$), and a fourth inductor 426 ($L_{22}$). The band pass filter match block 420 also includes a fourth capacitor 430 ($C_{21}$), a fifth capacitor 432 ($C_{22}$), a sixth capacitor 434 ($C_{23}$), a seventh capacitor 436 ($C_{24}$), an eighth capacitor 438 ($C_{25}$), and the ground terminal 416. The low pass filter match block 402 may be a high pass filter or a band pass filter. The band pass filter match block 420 may be a high pass filter or a low pass filter. The band pass filter match block 420 and the low pass filter match block 402 may be different types of filters. The band pass filter match block 420 and the low pass filter match block 402 may also be the same type of filter.

In one implementation, the low pass input port 404 inputs low frequency signals. The band pass input port 422 may input signals at certain band frequencies. A topology of the diplexer design 400 may use the low pass filter match block 402 to trap frequencies from the band pass input port 422. The diplexer design 400 may also use the band pass filter match block 420 to trap frequencies from the low pass input port 404.

Figure 4B:
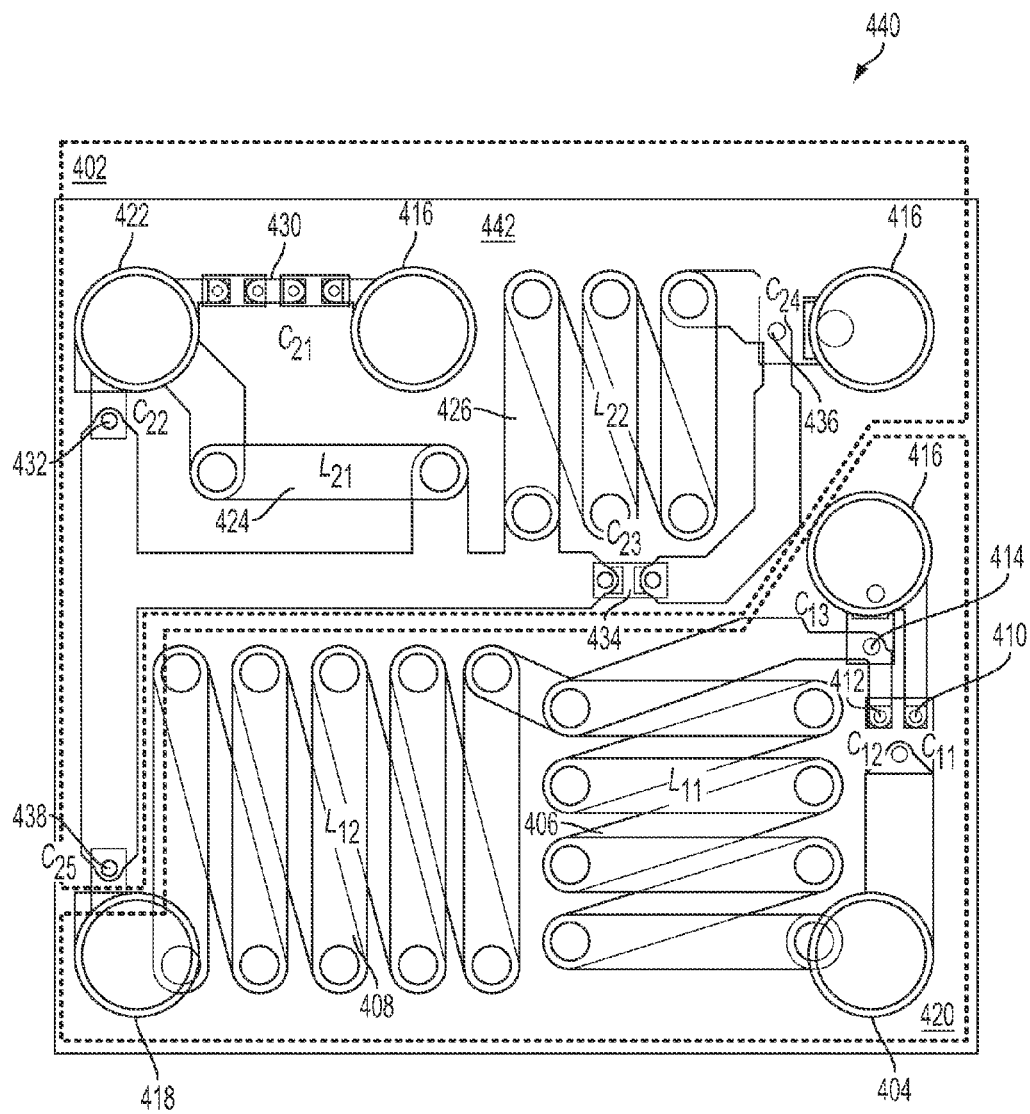
FIG. 4B is a top view of a layout of a diplexer design according to an aspect of the present disclosure.

FIG. 4B is a top view of a layout of a diplexer design 440 according to an aspect of the present disclosure. The layout of the diplexer design 440 corresponds to the schematic diagram of the diplexer design 400 from FIG. 4A. Also, the components are implemented within (or on) a semiconductor substrate 442. As shown in FIG. 4B, a low pass input pad 404, a band pass input pad 422, a ground terminal pad 416, and an antenna pad 418 are implemented as WLCSP balls although any suitable implementation could be used alternatively.

The capacitors (e.g., the first capacitor 410 ($C_{11}$), the second capacitor 412 ($C_{12}$), the third capacitor 414 ($C_{13}$), the fourth capacitor 430 ($C_{21}$), the fifth capacitor 432 ($C_{22}$), the sixth capacitor 434 ($C_{23}$), the seventh capacitor 436 ($C_{24}$), and the eighth capacitor 438 ($C_{25}$)) may be implemented as a layered structure (e.g., a layered metal-insulator-metal capacitor structure), but are not limited to the structure shown in FIG. 4B. In one implementation, the capacitor is disposed on only one side of the substrate, in order to conserve space and materials. Furthermore, the geometry and arrangement of the various inductor and capacitor components in the diplexer design 440 reduce the electromagnetic coupling between the components.

Figure 4C:
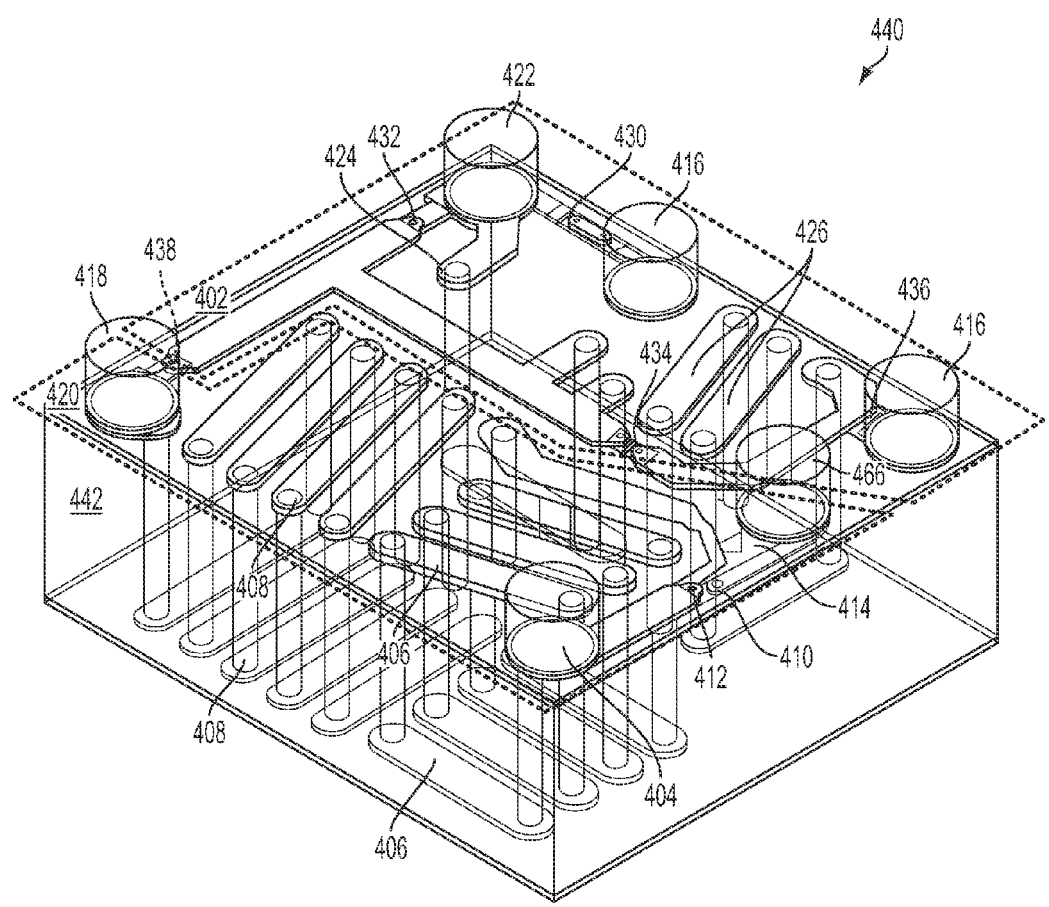
FIG. 4C is a 3D view of a layout of a diplexer design according to an aspect of the present disclosure.

In this configuration, the inductors (e.g., the first inductor 406 ($L_{11}$), the second inductor 408 ($L_{12}$), the third inductor 424 ($L_{21}$), and the fourth inductor 426 ($L_{22}$)) may be implemented as a series of traces and through substrate vias that are further illustrated in the 3D view of FIG. 4C. A more detailed explanation of the inductors is provided in FIG. 4C. Again, the structure of the inductors shown in FIG. 4B is not limited to the structure shown and can take on any structure. The layout of the diplexer design 440 is one implementation of the diplexer design 400 shown in FIG. 4A. Also, as shown in FIG. 4B, the low pass filter match block 402 and the band pass filter match block 420 are shown in the areas boxed in by the dotted-line borders.

FIG. 4C is a 3D view of a layout of a diplexer design 440 according to an aspect of the present disclosure. FIG. 4C is a 3D view of the same diplexer design 440 in FIG. 4B, and therefore has the same components as shown in FIG. 4B. In FIG. 4C, the inductors (e.g., the first inductor 406 ($L_{11}$), the second inductor 408 ($L_{12}$), the third inductor 424 ($L_{21}$), and the fourth inductor 426 ($L_{22}$)) are shown as through substrate via inductors (e.g., through glass via inductors if the semiconductor substrate 442 is glass). Representatively, the inductors (e.g., the first inductor 406 ($L_{11}$), the second inductor 408 ($L_{12}$), the third inductor ($L_{21}$) 424, and the fourth inductor 426 ($L_{22}$)) may have a first set of traces on a first surface of the semiconductor substrate 442, and a second set of traces on a second surface of the semiconductor substrate 442. In this configuration, the sets of traces are on opposing first and second surfaces of the semiconductor substrate 442 and coupled together by the through substrate vias in a serpentine manner. In FIG. 4C, the semiconductor substrate 442 is transparent to ease the viewing of both sets of traces and the through substrate vias of the inductors.

As shown in FIG. 4C, the capacitors (e.g., the first capacitor 410 ($C_{11}$), the second capacitor 412 ($C_{12}$), the third capacitor 414 ($C_{13}$), the fourth capacitor 430 ($C_{21}$), the fifth capacitor 432 ($C_{22}$), the sixth capacitor 434 ($C_{23}$), the seventh capacitor 436 ($C_{24}$), and the eighth capacitor 438 ($C_{25}$)) may be deposited on the first surface of the semiconductor substrate 442. Also, the low pass input pad 404, the band pass input pad 422, the antenna pad 418, and the ground terminal pad 416 may be deposited on the first surface of the semiconductor substrate 442. The low pass input pad 404, the band pass input pad 422, the antenna pad 418 and the ground terminal pad 416 may also be accessed by a cylindrical via (or other connection) for electrically coupling to other sources of voltage/current. The low pass filter match block 402 and the band pass filter match block 420 are shown within the dotted-line borders. In one implementation, the size of the diplexer design 440 is smaller than a conventional diplexer size, for example, at least due to the use of through substrate via/through glass via inductors for conserving space.

The diplexer design 440 may be a diplexer design for a different application (e.g., a small cell or a femto cell). This diplexer design (e.g., for a small cell application) is different from the one in FIG. 2A in that it has a low pass filter match branch and a band-pass filter match branch, while the design in FIG. 2A has a low pass filter branch and high pass filter branch. In this implementation, the fundamental difference is also more components added to combine the low pass filter and band pass filter into a single diplexer circuit.

Figure 4D:
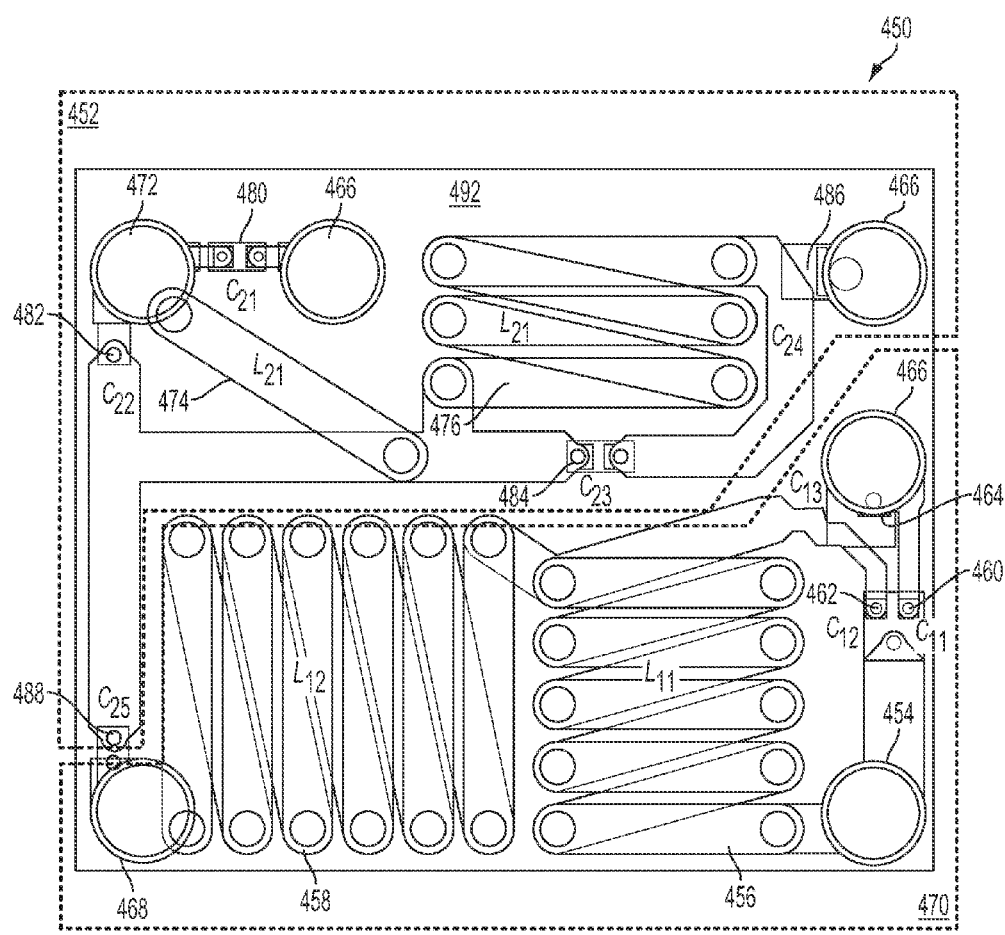
FIG. 4D is a top view of a layout of a diplexer design according to an aspect of the present disclosure.

FIG. 4D is a top view of a layout of a diplexer design 450 according to an aspect of the present disclosure. The layout of the diplexer design 450 corresponds to the schematic diagram of the diplexer design 400 from FIG. 4A. Also, the components are implemented within (or on) a semiconductor substrate 492. As shown in FIG. 4D, a low pass input pad 454, a band pass input pad 472, a ground terminal pad 466, and an antenna pad 468 are implemented as WLCSP balls, although any suitable implementation could be used alternatively. The components shown in FIG. 4D are also similar to the components shown in FIG. 4B, with some differences in terms of the arrangement and the capacitance/inductance values.

The capacitors (e.g., the first capacitor 460 ($C_{11}$), the second capacitor 462 ($C_{12}$), the third capacitor 464 ($C_{13}$), the fourth capacitor 480 ($C_{21}$), the fifth capacitor 482 ($C_{22}$), the sixth capacitor 484 ($C_{23}$), the seventh capacitor 486 ($C_{24}$), and the eighth capacitor 488 ($C_{25}$)) may be implemented as a layered structure (e.g., a layered metal-insulator-metal capacitor structure), but are not limited to the structure shown in FIG. 4D. In one implementation, the capacitor is disposed on only one side of the substrate, to conserve space and materials. Furthermore, the geometry and arrangement of the various inductor and capacitor components in the diplexer design 450 may reduce the electromagnetic coupling between the components. The capacitors in FIG. 4D may also have different capacitance values than their corresponding counterparts in FIG. 4B.

Figure 4E:
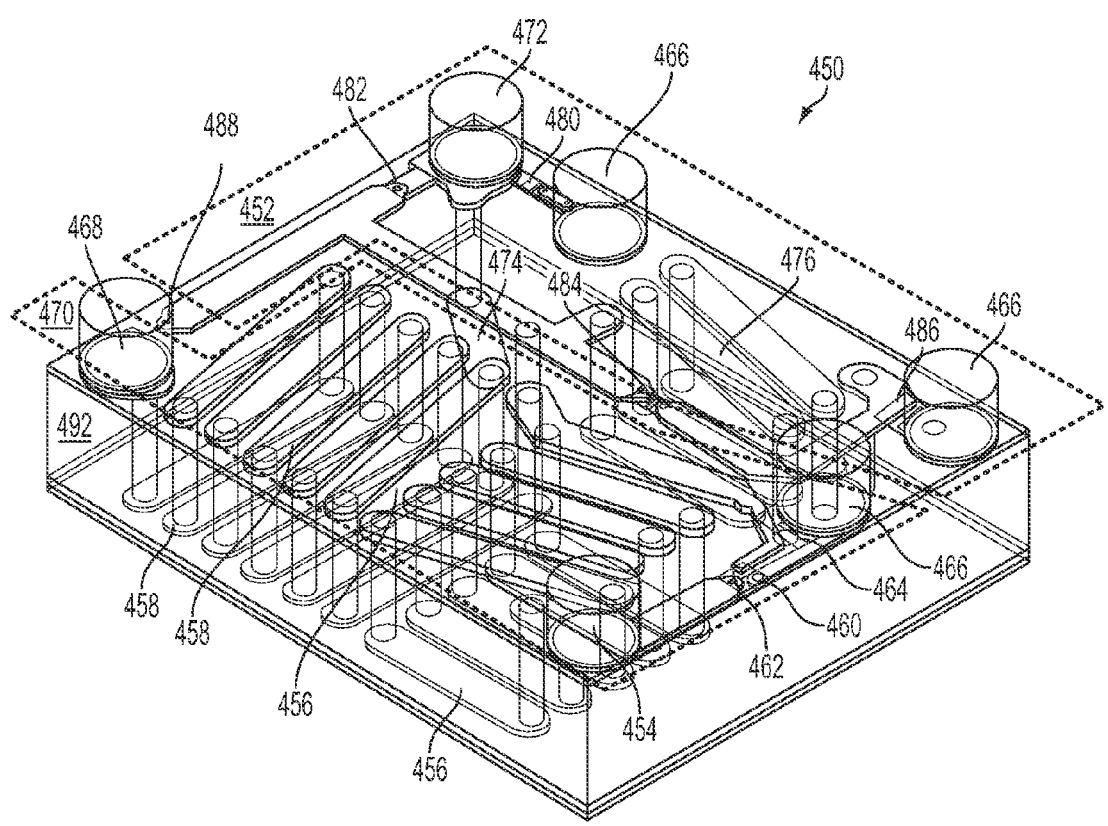
FIG. 4E is a 3D view of a layout of a diplexer design according to an aspect of the present disclosure.

In this configuration, the inductors (e.g., the first inductor 456 ($L_{11}$), the second inductor 458 ($L_{12}$), the third inductor 474 ($L_{21}$), and the fourth inductor 476 ($L_{22}$)) may be implemented as a series of traces and through substrate vias that are further illustrated in the 3D view of FIG. 4E. A more detailed explanation of the inductors is provided in FIG. 4E. Again, the structure of the inductors shown in FIG. 4D is not limited to the structure shown and can take on any structure. The layout of the diplexer design 450 is one implementation of the diplexer design 400 shown in FIG. 4A.

As shown in FIG. 4D, the low pass filter match block 452 and the band pass filter match block 470 are shown in the areas boxed in by the dotted-line borders. Furthermore, the third inductor 474 ($L_{21}$) in FIG. 4D is arranged in a diagonal pattern different than the third inductor 424 ($L_{21}$) shown in FIG. 4B, which is arranged in a horizontal pattern. Also, the fourth inductor 476 ($L_{22}$) in FIG. 4D is arranged in a horizontal pattern different than the fourth inductor 426 ($L_{22}$) shown in FIG. 4B, which is arranged in a vertical pattern. In addition, the first inductor 456 ($L_{11}$) in FIG. 4D has five traces, which is different than the first inductor 406 ($L_{11}$) in FIG. 4B, which has four traces. Also, the second inductor 458 ($L_{12}$) in FIG. 4D has six traces, which is different than the second inductor 408 ($L_{12}$) in FIG. 4B, which has five traces. All the inductors in FIG. 4D may also have different capacitance values than their corresponding counterparts in FIG. 4B.

FIG. 4E is a 3D view of a layout of a diplexer design 450 according to an aspect of the present disclosure. FIG. 4E is a 3D view of the same diplexer design 450 in FIG. 4D, and therefore has similar components to those shown in FIG. 4D. In FIG. 4E, the inductors (e.g., the first inductor 456 ($L_{11}$), the second inductor 458 ($L_{12}$), the third inductor 474 ($L_{21}$), and the fourth inductor 476 ($L_{22}$)) are shown as through substrate via inductors (e.g., through glass via inductors if the semiconductor substrate 492 is glass). Representatively, the inductors (e.g., the first inductor 456 ($L_{11}$), the second inductor 458 ($L_{12}$), the third inductor 474 ($L_{21}$), and the fourth inductor 476 ($L_{22}$)) may have a first set of traces on a first surface of the semiconductor substrate 492, and a second set of traces on a second surface of the semiconductor substrate 492. In this configuration, the sets of traces are on opposing first and second surfaces of the semiconductor substrate 492 and coupled together by the through substrate vias in a serpentine manner. In FIG. 4E, the semiconductor substrate 492 is transparent to ease the viewing of both sets of traces and the through substrate vias of the inductors.

As shown in FIG. 4E, the capacitors (e.g., the first capacitor 460 ($C_{11}$), the second capacitor 462 ($C_{12}$), the third capacitor 464 ($C_{13}$), the fourth capacitor 480 ($C_{31}$), the fifth capacitor 482 ($C_{22}$), the sixth capacitor 484 ($C_{23}$), the seventh capacitor 486 ($C_{24}$), and the eighth capacitor 488 ($C_{25}$)) may be deposited on the first surface of the semiconductor substrate 492. Also, the low pass input pad 454, the band pass input pad 472, the antenna pad 468, and the ground terminal pad 466 may be deposited on the first surface of the semiconductor substrate 492. The low pass input pad 454, the band pass input pad 472, the antenna pad 468 and the ground terminal pad 466 may also be accessed by a cylindrical via or other connection) for electrically coupling to other sources of voltage/current. The low pass filter match block 452 and the band pass filter match block 470 are shown within the dotted-line borders. In one implementation, the size of the diplexer design 450 is smaller than a conventional diplexer size, for example, at least due to the use of through substrate via/through glass via inductors for conserving space.

The diplexer design 450 may be a diplexer design for a different application (e.g., a small cell or a femto cell and also having a WLAN 5 GHz trap). This diplexer design (e.g., for a small cell application) is different from the one in FIG. 2A in that it has an low pass filter match branch and a band-pass filter match branch, while the one in FIG. 2A has a low pass filter branch and high pass filter branch, in this implementation, the fundamental difference is also more components added to combine the low pass filter and band pass filter into a single diplexer circuit. The particular diplexer design 450 shown in FIGS. 4D and 4E (when compared to the diplexer design 440 shown in FIGS. 4B and 4C) may also have the layout configuration, capacitance values and inductance values to achieve greater than 30 dB rejection at 5.5 GHz. This particular diplexer design 450 may also have a band-pass filter and a WLAN 5 GHz trap as the band-reject component.

In one implementation, thick conductive films (e.g., metal) may be used on both sides of the capacitors to make the capacitors have a high Q (or quality) factor. In one example, the bottom plate may have conductive film with a thickness of up to 5 μm and the top plate may have conductive film with a thickness of up to 3 μm. This may be uncommon in traditional CMOS based capacitors, which often use thin metals (e.g., 100 to 200 nm). In this implementation, the semiconductor substrate (e.g., the semiconductor substrates 242, 442, 492) may be fabricated from a low loss material that includes glass, air, quartz, sapphire, high-resistivity silicon, or other like semiconductor materials. In one implementation, the capacitor may also be disposed on only one side of the semiconductor substrate (e.g., the semiconductor substrates 242, 442, 492). In one implementation, the inductors (e.g., when the semiconductor substrates 242, 442, 492 are glass) are through glass via inductors. Such a through glass via implementation may also give the inductors a high Q (or quality) factor.

Figure 5:
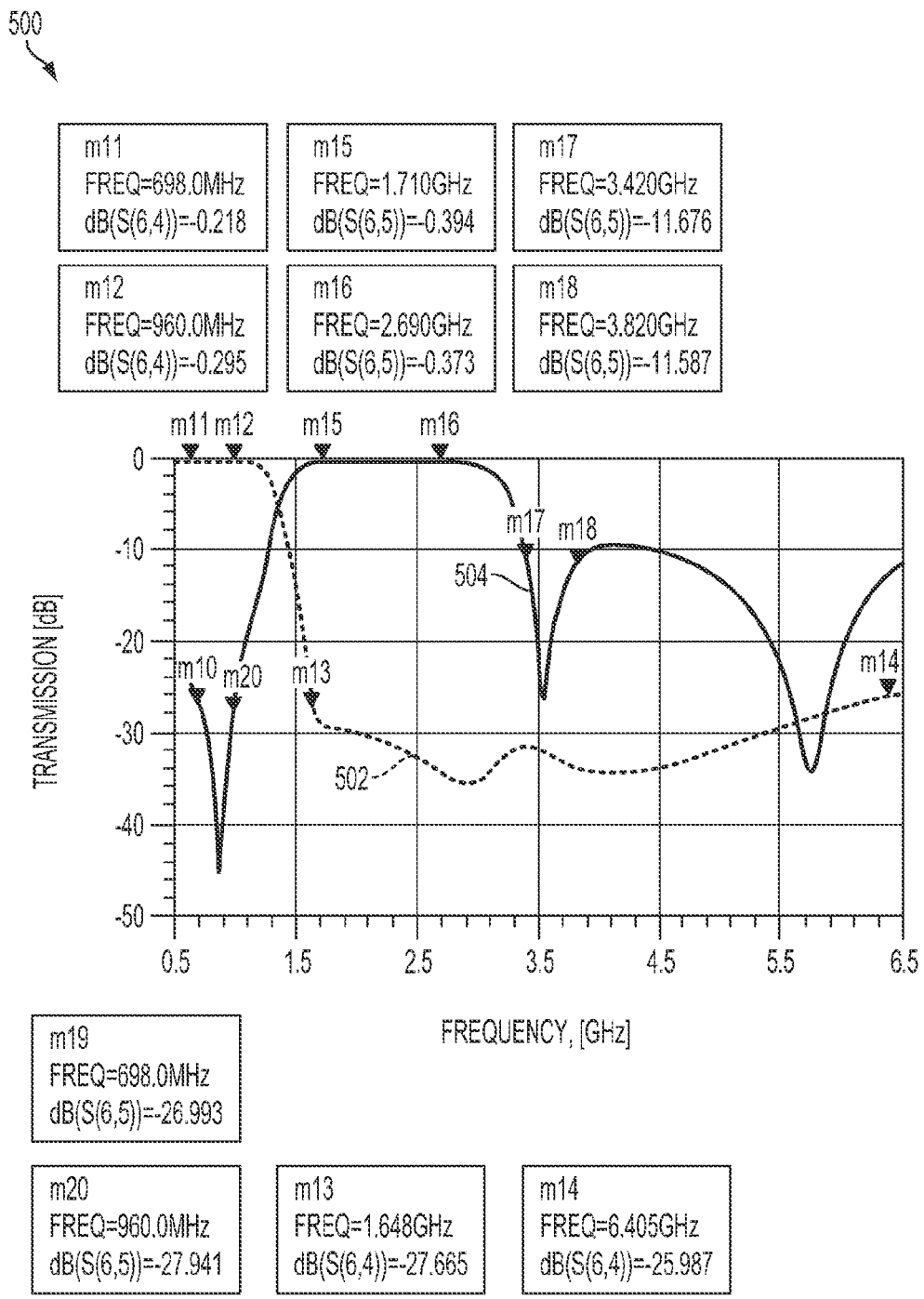
FIG. 5 is a graph illustrating performance of a diplexer design according to an aspect of the present disclosure.

FIG. 5 is a graph 500 illustrating performance of a diplexer design according to an aspect of the present disclosure. The graph 500 is similar to the graph 300 of FIG. 3. That is, the x-axis of the graph 500 reflects the frequency in gigahertz (GHz), and the y-axis of the graph 500 reflects a decibel (dB) rating. The curve 502 is the frequency response for the low pass filter branch, and the curve 504 is the frequency response for the band pass filter branch.

Even though it is not shown on the graph, the diplexer of the present disclosure may also achieve greater than 30 dB rejection (for example, around 34 dB) at 5.5 GHz, to trap the WLAN 5 GHz band. In one implementation, the greater than 30 dB rejection at 5.5 GHz results may be achieved with a low pass filter (with a frequency range of 698 to 960 MHz) and a band pass filter (with a frequency range of 1710 to 2690 MHz) in the same diplexer.

Figure 6:
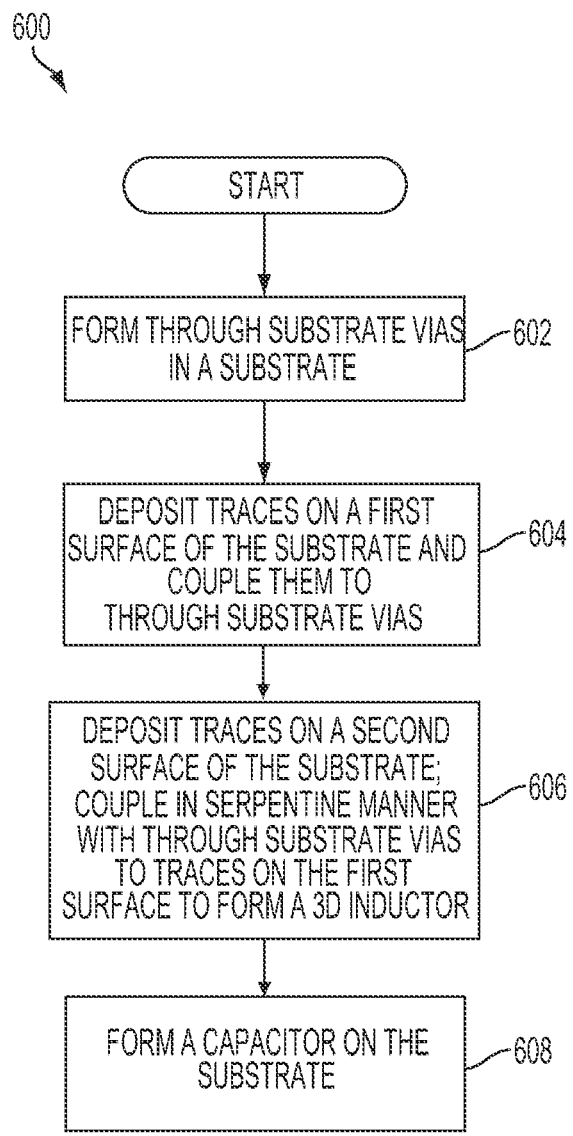
FIG. 6 is a process flow diagram illustrating a method of making a diplexer design according to an aspect of the present disclosure.

FIG. 6 is a process flow diagram illustrating a method 600 of making a diplexer design according to an aspect of the present disclosure. In block 602, through substrate vias are formed in a substrate. In block 604, a first set of traces are deposited on a first surface of the substrate and coupled to the through substrate vias. In block 606, a second set of traces are deposited on a second surface of the substrate. The traces on the first surface are coupled to the traces on the second surface by the through substrate vias in a serpentine manner to create a 3D through substrate via/through glass via inductor. In one implementation, the second surface of the substrate is opposite to the first surface of the substrate. In block 608, a capacitor is formed on the substrate. The capacitor may be formed on only one side of the substrate to conserve space and materials.

Although blocks are shown in a particular sequence, the present disclosure is not so limited. For example, block 608 (forming a capacitor on the substrate) may be performed prior to block 604 (depositing traces on a first surface of the substrate). In another example, block 608 (forming a capacitor on the substrate) may be performed prior to block 606 (depositing traces on a second surface of the substrate). The end result is a diplexer design, such as the diplexer design 240 of FIGS. 2B-2C or the diplexer designs 400, 440 or 450 of FIGS. 4A-4E.

According to a further aspect of the present disclosure, circuitry for diplexer designs using through glass via or through substrate via technology is described. The diplexer includes a substrate having through substrate vias. The diplexer also includes a first means for coupling the through substrate vias on a first surface of the substrate. The diplexer further includes a second a means for coupling the opposite ends of the through substrate vias on a second surface of the substrate opposite the first surface. In this configuration, the through substrate vias and the first and second means for coupling operate as a 3D inductor. The first and second means for coupling may be the traces shown in FIGS. 2B, 2C, 4B, and 4C.

In this configuration, the diplexer also includes a means for storing charge supported by the substrate. The charge storing means may be the a capacitors (e.g., the first capacitor 410 ($C_{11}$), the second capacitor 412 ($C_{12}$), the third capacitor 414 ($C_{13}$), fourth capacitor 430 ($C_{21}$), the fifth capacitor 432 ($C_{22}$), the sixth capacitor 434 ($C_{23}$), the seventh capacitor 436 ($C_{24}$), and the eighth capacitor 438 ($C_{25}$). In another aspect, the aforementioned means may be any module or any apparatus configured to perform the functions recited by the aforementioned means.

Figure 7:
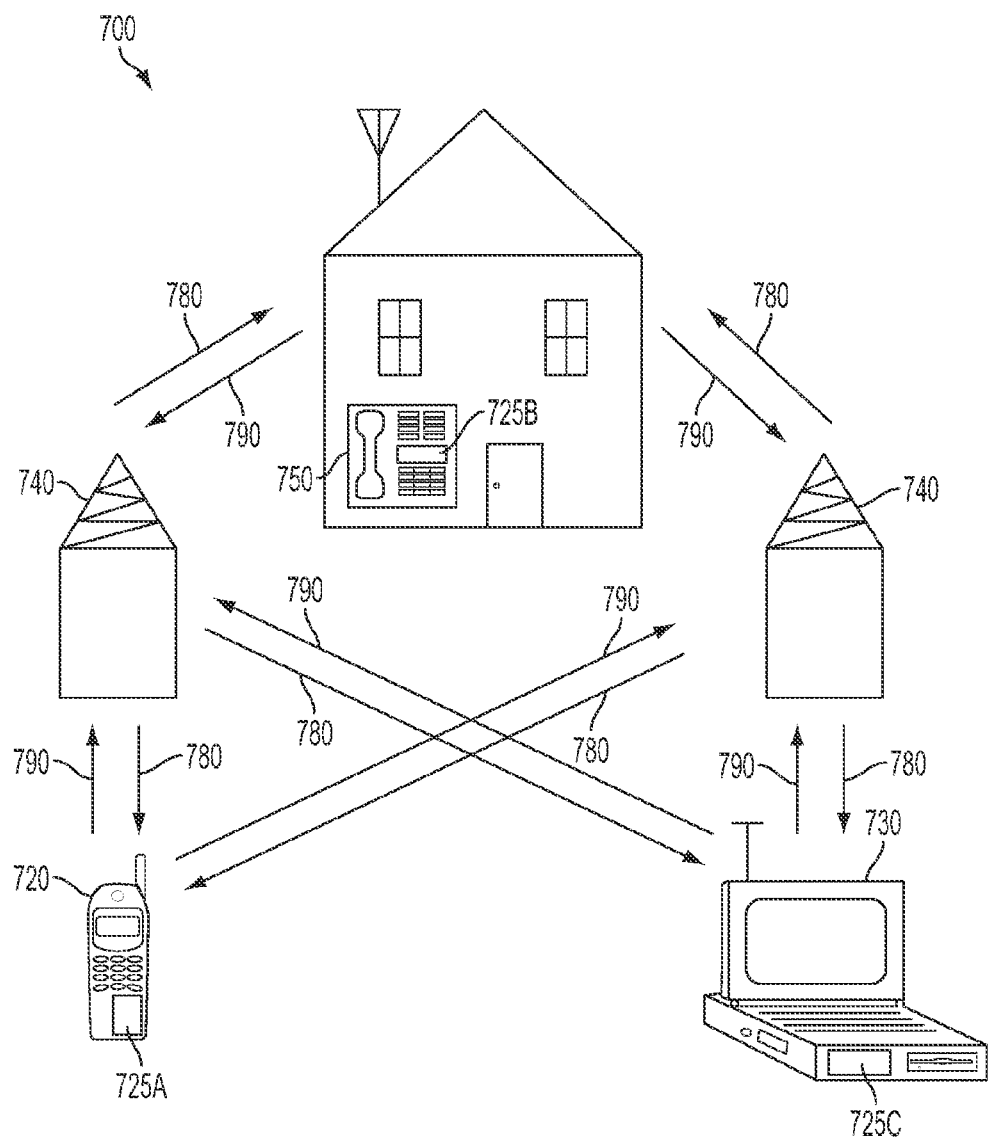
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed diplexer devices. It will be recognized that other devices may also include the disclosed diplexer devices, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed diplexer devices.

Figure 8:
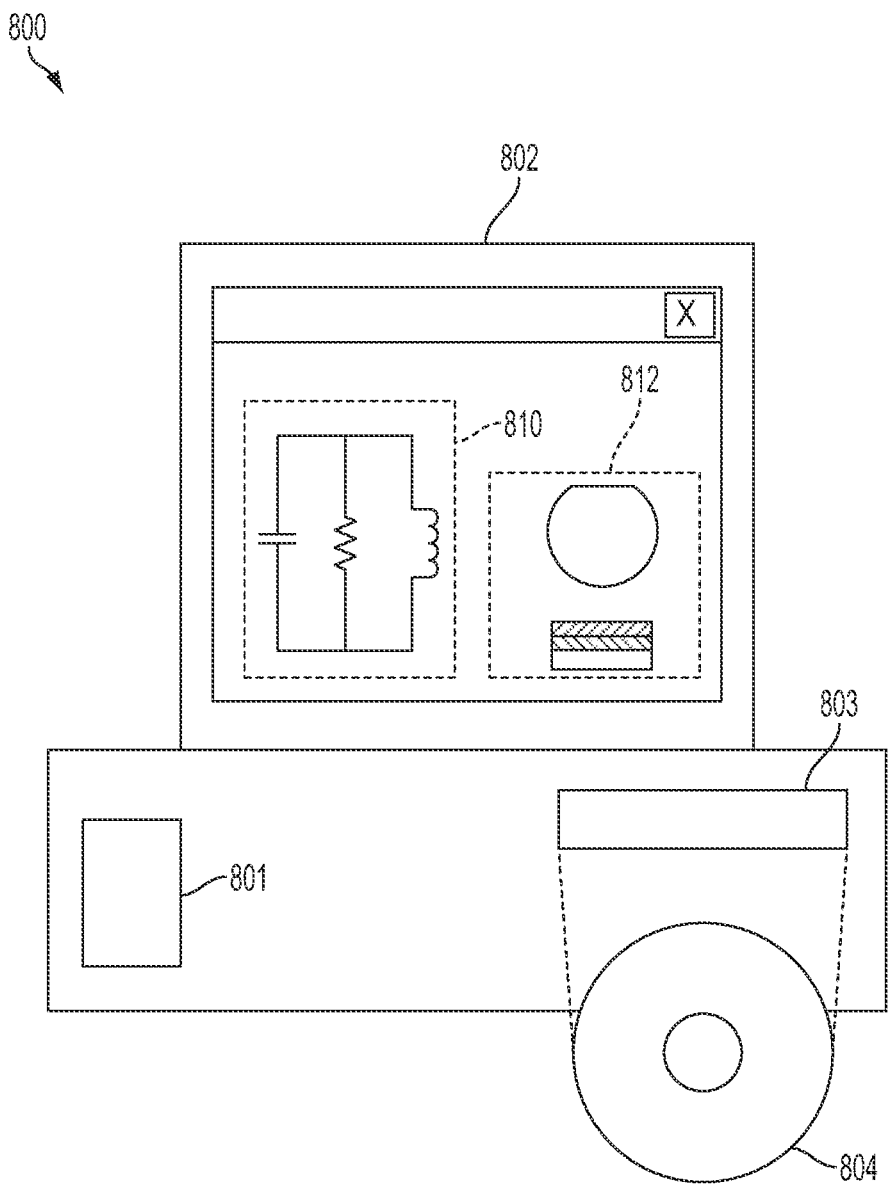
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the diplexer devices disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a diplexer device. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A diplexer, comprising:
   a substrate having a plurality of through substrate vias;
   a first plurality of traces on a first outer surface of the substrate, coupled to the plurality of through substrate vias;
   a second plurality of traces on a second outer surface of the substrate, opposite the first outer surface, coupled to opposite ends of the plurality of through substrate vias, the plurality of through substrate vias and traces operating as a 3D inductor; and
   a layered metal-insulator-metal capacitor structure directly supported by the first outer surface of the substrate and directly coupled to the 3D inductor.

2. The diplexer of claim 1, in which the layered metal-insulator-metal capacitor structure is supported by only one side of the substrate.

3. The diplexer of claim 1, in which the substrate comprises glass, air, quartz, sapphire or high-resistivity silicon.

4. The diplexer of claim 1, in which the layered metal-insulator-metal capacitor structure comprises conductive layers on opposing sides, the conductive layers having a thickness of approximately 1 um to 5 um.

5. The diplexer of claim 1, in which the diplexer has a rejection greater than 30 dB at a frequency of 5.5 GHz.

6. The diplexer of claim 1 integrated into a mobile phone, a set top box, a music player, a video player, an entertainment unit, a navigation device, a computer, a hand-held personal communication systems (PCS) unit, a portable data unit, and/or a fixed location data unit.

7. A diplexer, comprising:
   a first port;
   a second port;
   a third port;
   a low pass filter between two of the first port, the second port and the third port;
   a second pass filter between two other of the first port, the second port and the third port, the second pass filter comprising a band pass filter or a high pass filter; and a glass substrate supporting the first port, the second port and the third port.

8. The diplexer of claim 7, in which the low pass filter and the second pass filter each comprise a capacitor or an inductor.

9. The diplexer of claim 8, in which the inductor comprises a 3D inductor.

10. The diplexer of claim 8, in which the capacitor comprises conductive layers on opposing sides, the conductive layers having a thickness of approximately 1 to 5 um.

11. The diplexer of claim 8, in which the capacitor is supported by only one side of the substrate.

12. The diplexer of claim 7, in which the low pass filter is a filter configured to trap frequencies from the second port, and the second pass filter is a filter configured to trap frequencies from the first port.

13. The diplexer of claim 7, in which the second pass filter is a band pass filter, and the diplexer has a rejection greater than 30 dB at a frequency of 5.5 GHz.

14. The diplexer of claim 7 integrated into a mobile phone, a set top box, a music player, a video player, an entertainment unit, a navigation device, a computer, a hand-held personal communication systems (PCS) unit, a portable data unit, and/or a fixed location data unit.

15. A method of fabricating a diplexer, comprising:
forming a plurality of through substrate vias in a substrate;
depositing a first plurality of traces on a first outer surface of the substrate;
depositing a second plurality of traces on a second outer surface of the substrate;
coupling the first plurality of traces to first sides of the plurality of through substrate vias;
coupling the second plurality of traces to second sides of the plurality of through substrate vias to form a serpentine 3D inductor; and
forming a layered metal-insulator-metal capacitor structure directly on the first outer surface of the substrate.

16. The method of claim 15, further comprising integrating the diplexer into a mobile phone, a set top box, a music player, a video player, an entertainment unit, a navigation device, a computer, a hand-held personal communication systems (PCS) unit, a portable data unit, and/or a fixed location data unit.

17. An diplexer comprising:
a substrate having a plurality of through substrate vias;
a first plurality of traces on a first outer surface of the substrate;
first means for coupling the plurality of through substrate vias on the first outer surface of the substrate;
second means for coupling opposite ends of the plurality of through substrate vias on a second outer surface of the substrate opposite the first outer surface, the first plurality of traces and the first means for coupling and the second means for coupling operating as a 3D inductor; and
means for storing charge directly supported by the first outer surface of the substrate and directly coupled to the 3D inductor.

18. The diplexer of claim 17, integrated into a mobile phone, a set top box, a music player, a video player, an entertainment unit, a navigation device, a computer, a hand-held personal communication systems (PCS) unit, a portable data unit, and/or a fixed location data unit.

19. A method of fabricating a diplexer, comprising:
the step of forming a plurality of through substrate vias in a substrate;
the step of depositing a first plurality of traces on a first outer surface of the substrate;
the step of depositing a second plurality of traces on a second outer surface of the substrate;
the step of coupling the first plurality of traces to first sides of the plurality of through substrate vias;
the step of coupling the second plurality of traces to second sides of the plurality of through substrate vias to form a serpentine 3D inductor; and
the step of forming a layered metal-insulator-metal capacitor structure directly on the first outer surface of the substrate.

20. The method of claim 19, further comprising the step of integrating the diplexer into a mobile phone, a set top box, a music player, a video player, an entertainment unit, a navigation device, a computer, a hand-held personal communication systems (PCS) unit, a portable data unit, and/or a fixed location data unit.

* * * * *